US012811553B2

(12) United States Patent
Kastnes et al.

(10) Patent No.: US 12,811,553 B2
(45) Date of Patent: Nov. 24, 2026

(54) TRANSMITTER DEVICES

(71) Applicant: Nordic Semiconductor ASA, Trondheim (NO)

(72) Inventors: Paal Kastnes, Trondheim (NO); Czeslaw Makarski, Cracow (PL); Jedrzej Ciupis, Cracow (PL); Andrzej Kuros, Cracow (PL); Artur Hadasz, Cracow (PL); Piotr Slawecki, Cracow (PL); Dawid Przybylo, Cracow (PL)

(73) Assignee: Nordic Semiconductor ASA, Trondheim (NO)

( * ) Notice: Subject to any disclaimer, the term of this patent is extended or adjusted under 35 U.S.C. 154(b) by 543 days.

(21) Appl. No.: 18/236,866

(22) Filed: Aug. 22, 2023

(65) Prior Publication Data

US 2024/0072749 A1 Feb. 29, 2024

(30) Foreign Application Priority Data

Aug. 25, 2022 (GB) ...................................... 2212391

(51) Int. Cl.
*H03G 3/30* (2006.01)
*H03F 3/24* (2006.01)
*H04B 1/04* (2006.01)

(52) U.S. Cl.
CPC ........... *H03G 3/3042* (2013.01); *H03F 3/245* (2013.01); *H03F 2200/451* (2013.01); *H03G 2201/103* (2013.01); *H03G 2201/307* (2013.01); *H04B 1/04* (2013.01)

(58) Field of Classification Search
CPC .............................. H03G 3/3042; H03F 3/245
See application file for complete search history.

(56) References Cited

U.S. PATENT DOCUMENTS 10,461,713 B1 * 10/2019 Engelien-Lopes ...... H03F 3/195
2006/0220742 A1 10/2006 Manku
2010/0093291 A1 * 4/2010 Embabi ............... H03G 3/3042 455/127.2
2011/0148519 A1 * 6/2011 Drogi .................. H03G 3/3042 330/129
2012/0135697 A1 5/2012 Park et al.
2015/0349838 A1 * 12/2015 Petrovic .................. H03G 3/34 375/221

(Continued)

OTHER PUBLICATIONS

IPO Combined Search and Examination Report under Sections 17 and 18(3) for GB2212391.3, mailed Feb. 20, 2023, 6 pages.

*Primary Examiner* — David Bilodeau
(74) *Attorney, Agent, or Firm* — Klarquist Sparkman, LLP

(57) ABSTRACT

A control portion for controlling an amplifier portion of a transmitter device is provided. The amplifier portion is arranged to amplify a radio signal with a transmission gain based at least partially on a gain control signal and having a nominal gain relationship between the gain control signal and the transmission gain. The control portion is arranged to determine a desired transmission gain, to determine one or more operating conditions, to calculate a gain control signal for causing the amplifier portion to apply the desired transmission gain, taking into account the nominal gain relationship and the one or more operating conditions, and to output said gain control signal. The gain control signal is different to a gain control signal calculated based only on the nominal gain relationship.

17 Claims, 3 Drawing Sheets

(56) References Cited

U.S. PATENT DOCUMENTS

| | | | | |
|---|---|---|---|---|
| 2017/0040954 | A1* | 2/2017 | Darwish | H03G 1/0035 |
| 2020/0099457 | A1* | 3/2020 | Lübbers | H03F 1/32 |
| 2020/0169235 | A1* | 5/2020 | Valk | H03F 3/24 |
| 2021/0203282 | A1* | 7/2021 | Van Liere | H04L 25/08 |
| 2022/0247368 | A1 | 8/2022 | Chen et al. | |

* cited by examiner

TRANSMITTER DEVICES

CROSS REFERENCE TO RELATED APPLICATION

This application claims priority from Great Britain Application No. 2212391.3, filed Aug. 25, 2022, which application is incorporated herein by referenced in its entirety.

BACKGROUND OF THE INVENTION

The present invention relates to transmitter devices and the control of transmission gain of said devices.

Radio transmitters typically operate by modulating a carrier signal to encode some data to be transmitted, and then amplifying and broadcasting this modulated radio signal using one or more antennas. The signal can then be detected and demodulated by a receiver to recover the encoded data.

The distance at which a receiver can successfully recover the encoded data depends somewhat on the power with which the signal is transmitted by the transmitter. In general, higher transmitter power outputs enable longer range communications.

It is often desirable to control accurately the transmission power of a radio transmitter. For instance, in many countries transmitter power outputs are tightly regulated, with strict power limits in certain frequency bands. Accurate control allows transmission power to be set as close as possible to the regulatory maximums. It may also be beneficial to accurately control the power used by a transmitter device with limited energy resources, e.g. to maximise battery life.

Many transmitter devices include a control portion which generates the modulated radio signals in which data is encoded and a front-end portion which handles amplification and the actual transmission. Some front-end portions, such as the Nordic Semiconductor nRF21540, allow a control circuit to control the transmission gain applied by the front-end portion (e.g. so as to achieve a desired transmission power). However, conventional mechanisms for controlling transmission gain are not accurate in all operating conditions. An improved approach may be desired.

SUMMARY OF THE INVENTION

According to a first aspect of the present invention there is provided a control portion for controlling an amplifier portion of a transmitter device, said amplifier portion arranged to amplify a radio signal with a transmission gain based at least partially on a gain control signal and having a nominal gain relationship between the gain control signal and the transmission gain, wherein the control portion is arranged:

- to determine a desired transmission gain;
- to determine one or more operating conditions;
- to calculate a gain control signal for causing the amplifier portion to apply the desired transmission gain, taking into account the nominal gain relationship and the one or more operating conditions, the gain control signal being different to a gain control signal calculated based only on the nominal gain relationship; and
- to output said gain control signal.

The invention extends to a transmitter device comprising:

- an amplifier portion arranged to amplify a radio signal with a transmission gain based at least partially on a gain control signal and having a nominal gain relationship between the gain control signal and the transmission gain; and
- a control portion as disclosed herein, arranged to control the amplifier portion by outputting the gain control signal to said amplifier portion.

According to a second aspect of the present invention there is provided a method of controlling an amplifier portion of a transmitter device, said amplifier portion arranged to amplify a radio signal with a transmission gain based at least partially on a gain control signal and having a nominal gain relationship between the gain control signal and the transmission gain, the method comprising:

- determining a desired transmission gain;
- determining one or more operating conditions;
- calculating a gain control signal or causing the amplifier to apply the desired transmission gain, taking into account the nominal gain relationship and the one or more operating conditions, the gain control signal being different to a gain control signal calculated based only on the nominal gain relationship; and
- outputting said gain control signal to the amplifier portion.

Thus, it will be seen by those skilled in the art that the present invention may allow a transmission gain delivered by an amplifier portion to be controlled more accurately by taking into account the one or more operating conditions, rather than simply basing a gain control portion on a nominal gain relationship of the amplifier portion. This may allow the control portion to control transmission power more accurately, enabling, for instance, a transmitter device to transmit radio signals with a transmission power that closely approaches a regulatory limit.

The nominal gain relationship indicates the theoretical relationship between a gain control signal received by the amplifier portion and the transmission gain delivered by the amplifier portion. The nominal gain relationship may be provided for a particular model of amplifier portion or may even be specific to the particular amplifier portion used. The control portion may be arranged to detect information identifying the nominal gain relationship from the amplifier portion (e.g. a model number and/or calibration information identifying a nominal gain relationship specific to that amplifier portion). The nominal gain relationship may provide a reasonable estimate of the gain that will be delivered by the amplifier portion for a particular gain control signal. However, the actual transmission gain delivered by the amplifier portion may vary for a given gain control signal depending on the conditions in which the amplifier portion is used. Whilst the conditions in which the nominal gain relationship is valid may be chosen to reflect the most likely conditions for the amplifier portion, the nominal gain relationship cannot account for changing and/or unusual operating conditions.

In conventional devices, condition-dependent variations in the gain delivered by the amplifier portion can make it difficult to accurately control transmission power and may necessitate the use of conservative gain control values to ensure that regulatory limits are not exceeded. However, the control portion of the present invention compensates at least partially for these variations by taking into account the one or more operating conditions when calculating the gain control signal, making it more likely that the gain control signal will result in the amplifier portion delivering the desired gain. In other words, the control portion adjusts the gain control signal from the nominally-expected value to counteract the effects of changes in the one or more operating conditions. For instance, if the nominal relationship may be calibrated for an operating temperature of 20° C. and the current temperature is 30° C., the control module would determine a gain control signal which compensates for this difference.

The gain control signal may indicate one of a plurality of gain settings for the amplifier portion in which the amplifier portion delivers different transmission gains (i.e. with each gain setting nominally delivering the transmission gain indicated by the nominal gain relationship). For example, the gain control signal may comprise or encode a numeric value. For instance, the amplifier portion may be designed and/or calibrated to have a plurality of gain settings which deliver a plurality of nominally corresponding gains under a set of standard or expected operating conditions. The amplifier portion may be operable in a plurality of discrete gain settings corresponding to different gain control signals. In some embodiments, the gain control signal may be an analogue signal which indicates one of a continuum of gain settings of the amplifier portion.

The amplifier portion may comprise one or more registers which define the gain setting the amplifier portion operates in. The gain control signal may be configured to as to update said register to cause the amplifier portion to apply the appropriate gain.

The one or more operating conditions that are determined and taken into account may include environmental conditions such as temperature and/or humidity (e.g. an ambient temperature or a temperature of the transmitter device or the amplifier portion). Changing environmental conditions such as temperature and humidity may affect the gain behaviour of the amplifier portion due, for instance, to changing properties of materials (e.g. semiconductors) that comprise the amplifier portion. Additionally or alternatively, in some embodiments, the one or more operating conditions determined and taken into account may include one or more conditions specific to the transmitter device such as a supply voltage to the transmitter device and/or conditions specific to the radio signal, such as an input power level or a carrier frequency.

The control portion may be arranged to determine the one or more operating conditions by receiving information from a source external to the transmitter device e.g. measurement data from a separate sensing device or a remote server. However, in a set of embodiments the transmitter device comprises one or more sensors arranged to measure the one or more operating conditions. For instance, the transmitter device may comprise a temperature sensor arranged to measure a temperature of the transmitter device and/or a voltage sensor arranged to measure a supply voltage to the transmitter device. The sensor(s) may be integral with the control portion, e.g. the sensor(s) and the control portion may both be comprised by a System on Chip (SoC).

The desired gain may be determined based on a desired transmission power. The control portion may determine the desired gain to be equal or approximately equal to a gain required to achieve a desired transmission power, based on an expected input power of a radio signal (i.e. by dividing the desired transmission power by the expected input power). For instance, the desired gain may be determined to achieve a transmission power that approaches but does not exceed a regulatory power limit. The desired gain and/or a desired transmission power may be determined internally by the control portion or received from another portion of the transmitter device (e.g. a protocol driver and/or a user of the device).

The gain control signal for causing the amplifier to apply the desired transmission gain may be calculated by determining an effective relationship between the gain control signal and the actual gain delivered by the amplifier portion (i.e. adjusting the nominal relationship to account for the current condition(s)). The effective relationship may be expressed by a mathematical function, e.g. with the actual gain expressed as a linear, polynomial or other mathematical function of the gain control signal (or vice versa). Alternatively the effective relationship is expressed by means of a look-up table in which gain control signals (e.g. possible values of a numeric gain control signal) are mapped to corresponding actual gains. This may allow for faster operation. The gain control signal for causing the amplifier to apply the desired transmission gain may be found using the effective relationship to identify the gain control signal that is expected to deliver the desired transmission gain (or a transmission gain closest to the desired transmission gain).

In a set of embodiments, multiple operating conditions are determined and taken into account when calculating the gain control signal. The control portion may be arranged to determine a plurality of operating conditions. The control portion may be arranged to calculate a gain control signal which will cause the amplifier portion to apply the desired transmission gain, taking into account the plurality of operating conditions.

In a set of embodiments, the control portion is arranged to calculate the gain control signal using a model of the amplifier portion. The model may reflect how one or more operating conditions affects an effective relationship between the gain control signal and a gain produced by the amplifier portion. In some embodiments, a model of the amplifier portion is used to determine the effective relationship between a gain control signal and an actual gain delivered by the amplifier portion for the one or more operating conditions. As explained above, this effective relationship may then be used to calculate the gain control signal required to achieve the desired gain.

In some embodiments, the model is used to determine one or more parameters of a mathematical function which describes the effective relationship. The model may be used to determine one or more coefficients of a linear, polynomial or other mathematical function expressing the effective relationship. For example, the effective relationship may be expressed as a linear combination of one or more functions of one or more respective operational factors. For instance, the effective relationship may be expressed as:

$$G=A(X,g)+B(Y,g)+C(Z,g),$$

where G is the actual gain, g is the value of the gain control signal and X, Y, and Z are the operating conditions taken into account in this example.

The model used by the control portion may comprise an empirical model of the amplifier portion (e.g. based on a previous tests of the amplifier portion or an equivalent or similar amplifier portion). The empirical model may be generated by measuring how one or more operating conditions affects the relationship between the gain control signal and a gain produced by the amplifier portion or an equivalent amplifier portion used for testing purposes. The empirical model may comprise a curve of best-fit to previous measured behaviour of the amplifier portion (e.g. A(X,g) may be found by fitting a curve to previous measured behaviour of the amplifier portion at different temperatures).

Additionally or alternatively, the model comprises a physical model (i.e. which uses physical principles to determine how one or more operating conditions affects the relationship between the gain control signal and a gain produced by the amplifier portion). In embodiments where a plurality of operating conditions is taken into account, the effect of one or more operating conditions may be modelled empirically and the effect of one or more other operating conditions may be modelled physically. The model used by the control portion may be changed or adjusted as required (e.g. if the transmitter device is used in a different situation with different ranges of operating conditions). The model may be updated by updating software executed by the control portion.

During use, the operating conditions may change. For instance, the temperature may increase or decrease, and/or the carrier frequency of radio signals may change according to a frequency hopping protocol. In some embodiments, the control portion is arranged to update the calculated gain control signal for causing the amplifier portion to apply the desired transmission gain, taking into account updated operating conditions. The control portion may be arranged to update the calculated gain control signal at regular intervals and/or when the one or more operating conditions changes by a threshold amount (e.g. an amount sufficient to affect appreciably the gain delivered by the amplifier portion).

In some embodiments, one or more of the operating conditions taken into account when calculating the gain control signal changes over relatively long timescales (e.g. greater than one second). For instance, variations of the temperature of the transmitter device sufficient to affect appreciably the gain delivered by the amplifier portion may happen over timescales of seconds, minutes or hours. Additionally or alternatively, in some embodiments an operating condition taken into account when calculating the gain control signal changes over relatively short timescales. For instance, the carrier frequency with which the radio signal is transmitted may affect the gain performance of the amplifier portion and may change tens, hundreds or even thousands of times per second (e.g. when a frequency hopping transmission protocol is used).

Updating the calculated gain control signal may comprise re-calculating the effective relationship using the model each time an update is needed. However, the processing time required for re-calculation may make it difficult to keep up with fast-changing operating conditions.

Therefore, in a set of embodiments, the control portion is arranged to calculate a set of gain control signals for causing the amplifier portion to apply the desired transmission gain, for a corresponding set of the one or more operating conditions (i.e. for a set of possible values of one or more operating conditions, e.g. a set of possible carrier frequencies). In other words, the control portion is arranged to prepare a set of pre-calculated gain control signals for at least one operating condition that is not currently occurring, to save processing time if that operating condition subsequently occurs. For instance, the control portion may be arranged to populate a look-up table with gain control signals appropriate for causing the amplifier portion to apply the desired transmission gain for a set of different operating conditions (e.g. a range of carrier frequencies). The control portion may then simply retrieve and output an appropriate gain control signal from the (previously-calculated) set when the relevant operating condition(s) change(s) by a threshold amount. This may allow for faster operation than recalculating the gain control signal entirely (e.g. using a model of the amplifier portion) every time an operating condition changes, allowing the control portion to compensate in real time for volatile operating conditions (e.g. changing carrier frequencies due to the use of a frequency hopping protocol).

In some embodiments, the control portion is arranged to re-calculate the gain control signal for some changes in operating conditions and to retrieve an updated gain control signal from a previously-calculated set for other changes in operating conditions. For instance, the control portion is arranged to re-calculate the gain control signal for sufficiently large changes in relatively slow-moving conditions such as temperature, and to retrieve a pre-calculated gain control signal for fast-changing conditions such as carrier frequency. For instance, if the temperature is expected to be largely constant but the carrier frequency to vary frequently, the control portion may be arranged to pre-calculate, for the current temperature, a set of gain control signals for a corresponding set of possible carrier frequencies. As the carrier frequency changes, the control portion can then simply retrieve and output the appropriate pre-calculated gain control signal. If, after some time, the temperature has changed by more than a threshold amount, the control portion may be arranged to re-calculate the set of gain control signals for the corresponding set of possible carrier frequencies for the new temperature.

In a set of embodiments, the amplifier portion comprises an RF power amplifier. The transmitter device may comprise a transceiver device. In some such embodiments the amplifier portion may comprise both reception and transmission components. For instance, the amplifier portion may comprise an RF frontend portion comprising a transmission power amplifier and a reception low-noise amplifier. The amplifier portion may comprise one or more switching elements for switching between transmission and reception modes. The transmitter device may be arranged to operate in a variety of frequency channels, e.g. to operate according to a frequency-hopping protocol. In a set of embodiments the transmitter device is arranged to operate in the 2.4 GHz frequency band.

The radio signals may be generated by any appropriate portion of the transmitter device or even externally to the transmitter device. However, in a set of embodiments the control portion is arranged to generate radio signals for amplifying with the amplifier portion. For instance, the control portion may be arranged to perform one or more of data encoding, modulation, pre-amplification, mixing or filtering steps to generate radio signals for amplifying with the amplifier portion. Additionally or alternatively, one or more of these steps may be performed by a different portion of the transmitter device. The control portion may comprise or be comprised by a system on chip (SoC). The control portion may comprise an interface such as a serial peripheral interface (SPI) arranged to output the gain control signal. The amplifier portion may comprise a corresponding interface (e.g. an SPI) arranged to receive the gain control signal.

The amplifier portion may be provided integrally with the control portion. For instance, the amplifier portion and the control portion may be provided as part of the same system on chip (SoC). In such embodiments, the gain control signal may comprise an internal signal sent from the amplifier portion to the control portion. However, in a set of a embodiments the amplifier portion is provided separately to the control portion.

As mentioned above, the invention extends to a transmitter device comprising the amplifier portion and the control portion. However, in some embodiments, at least part of the control portion may be provided separately, e.g. remotely. The invention extends to a transmitter system comprising:

- a transmitter device comprising an amplifier portion arranged to amplify a radio signal with a transmission gain based at least partially on a gain control signal and having a nominal gain relationship between the gain control signal and the transmission gain; and
- a control portion as disclosed herein, arranged to control the amplifier portion by outputting the gain control signal to said amplifier portion, wherein at least part of the control portion is separate to the transmitter device.

Providing at least part of the control portion separately to the transmitter device may allow additional processing resources to be used for determining the gain control signal without requiring these to be provided locally by the transmitter device. For example, the control portion may comprise a remote processing device (e.g. a remote server). The control portion may be provided partially locally and partially remotely, i.e. the control portion may comprise a remote processing device and a local control element that is part of the transmitter device. In such embodiments, any and all of the functions of the control portion described above may be performed by the remote processing device, the local control element or a mixture of both. Of course, as explained above, in other embodiments the control portion may be provided entirely locally (i.e. as part of the transmitter device). In general, possible features of the transmitter device disclosed above will be understood to be possible features of the transmitter system (e.g. features of the amplifier portion).

The remote processing device may be arranged to perform or assist with one or more of: determining the desired transmission gain; determining one or more operating conditions; calculating a gain control signal for causing the amplifier portion to apply the desired transmission gain, taking into account the nominal gain relationship and the one or more operating conditions, the gain control signal being different to a gain control signal calculated based only on the nominal gain relationship; and outputting said gain control signal. Outsourcing part or all of one or more of these steps to a remote processing device may reduce the amount of processing that needs to be performed locally by the transmitter device, e.g. reducing the cost, size and/or power use of the transmitter device. The remote processing device may be arranged to communicate with the transmitter device (e.g. with a local control element or directly to the amplifier portion) by any appropriate wired or wireless communication protocol.

In a set of embodiments, the remote processing device is arranged to prepare or assist with the preparation of a set of pre-calculated gain control signals, which are then applied using a local control element of the control portion. For instance, the remote processing device may be arranged to calculate or assist with the calculation of a set of gain control signals for causing the amplifier portion to apply the desired transmission gain, for a corresponding set of the one or more operating conditions. A local control element of the control portion may then store the set locally and retrieve and output an appropriate gain control signal from the (previously-calculated) set when the relevant operating condition(s) occur. When the set of gain control signals needs to be updated/re-calculated, this may be done remotely, with the local set updated in due course.

Features of any aspect or embodiment described herein may, wherever appropriate, be applied to any other aspect or embodiment described herein. Where reference is made to different embodiments, it should be understood that these are not necessarily distinct but may overlap.

BRIEF DESCRIPTION OF THE DRAWINGS

One or more non-limiting examples will now be described, by way of example only, and with reference to the accompanying figures in which:

FIG. 2 is a flow diagram illustrating operation of the transmitter device; and.

FIG. 1 shows a transmitter device 100 comprising a System on Chip (SoC) 102, an RF front-end portion 104 and an antenna 106. The SoC 102 comprises a supply voltage sensor 108 and a temperature sensor 110. The front-end portion 104 comprises a power amplifier 112.

Figure 1:
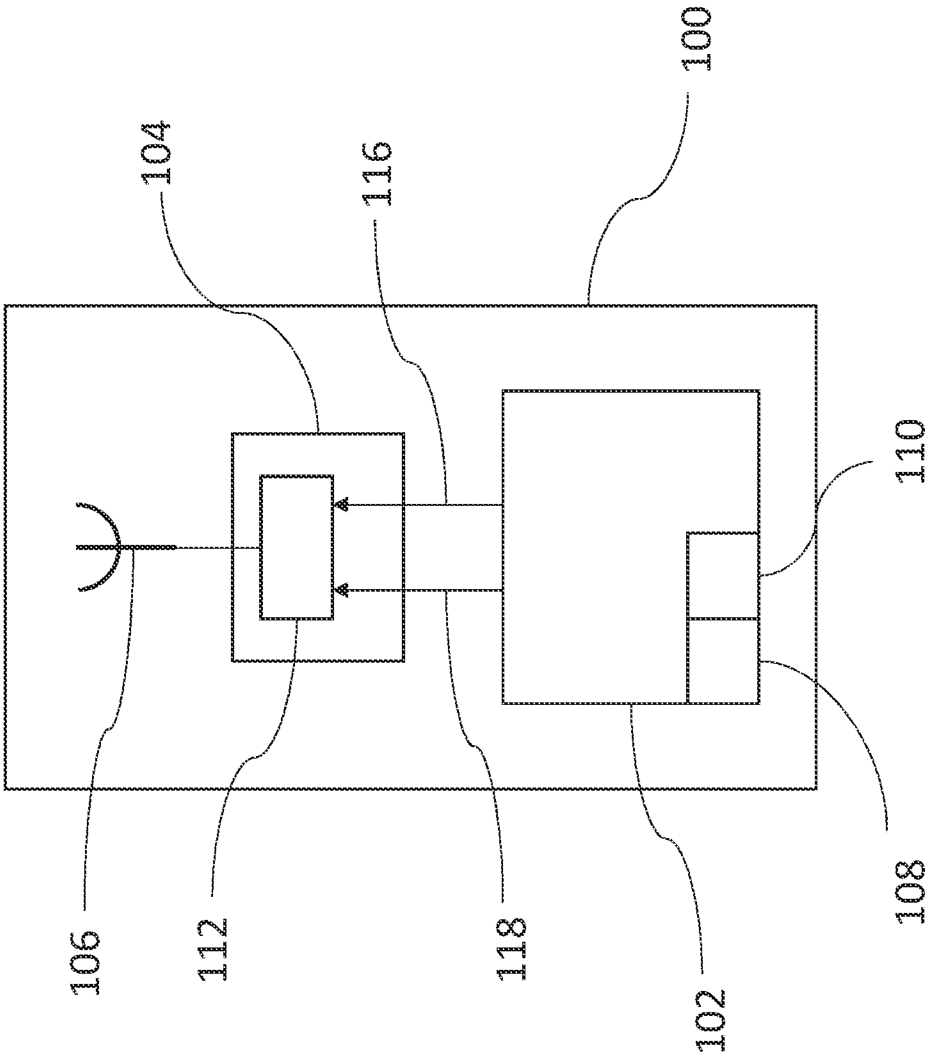
FIG. 1 is a schematic diagram of a transmitter device according to an embodiment of the invention.

In use, the SoC 102 produces radio signals 116 and sends these to the front-end portion 104 along with a gain control signal 118 which specifies a gain setting the front-end portion 104 should use when amplifying the radio signals 116. The front-end portion 104 amplifies the signals 116 according to the gain control signal 118 using the power amplifier 112 and sends the amplified signals to the antenna 106, where they are transmitted.

Figure 2:
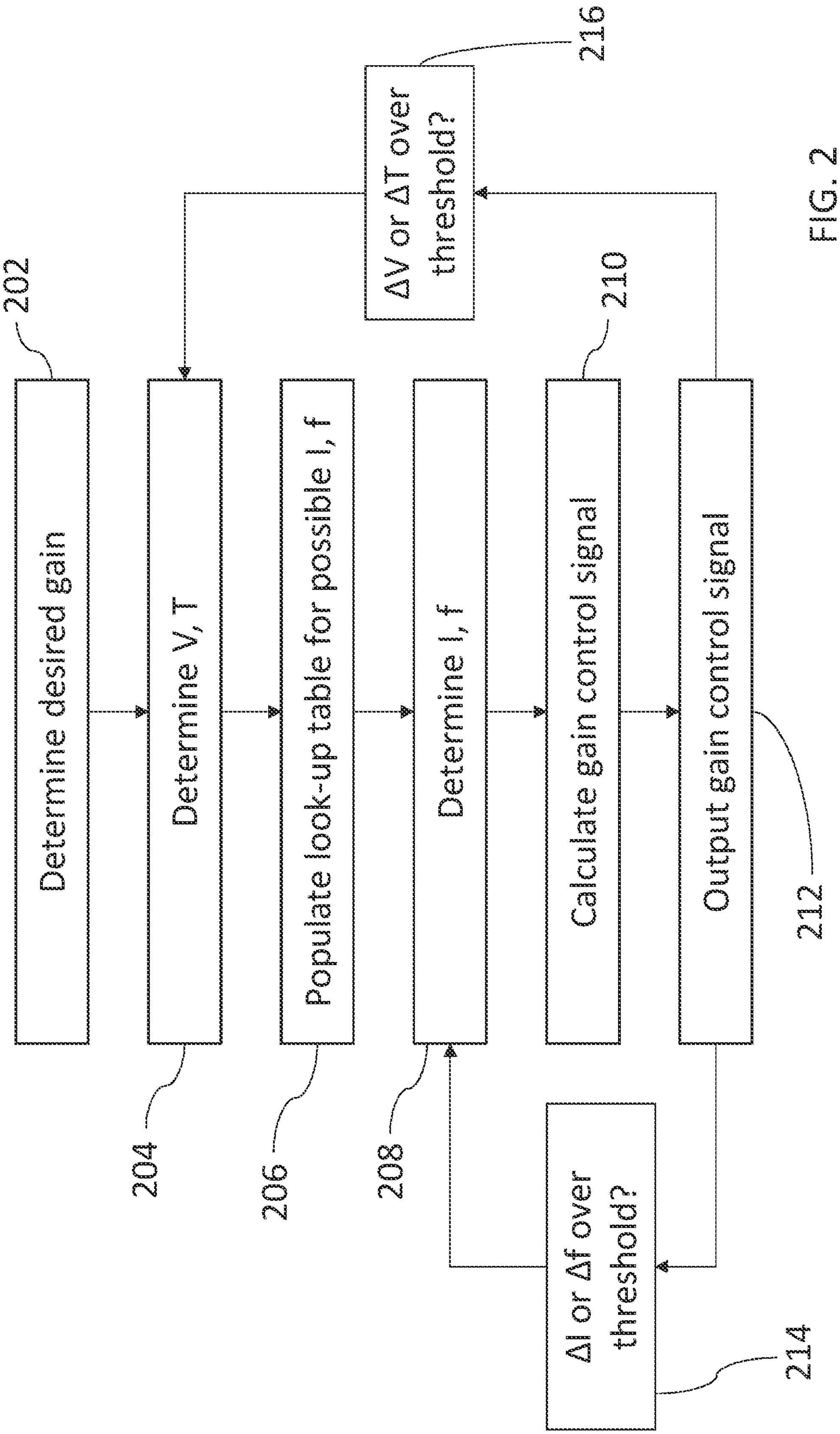

The SoC 102 determines the gain control signal 118 to send to the front-end portion 104 based on a desired gain, a nominal gain relationship and the operating conditions in which the transmitter device 100 is used. The process of determining the gain control signal 118 will now be described in more detail with additional reference to FIG. 2.

In a first step 202, the SoC 102 determines a desired transmission gain. In this example, the desired gain 212 is selected by the SoC 102 to maximise the transmission power of the output signal without exceeding a regulatory transmission power limit. In the remaining steps the SoC 102 determines a gain control signal 118 to send to the front-end portion 104 so that the front-end portion delivers the desired gain.

In a second step 204, the SoC 102 measures the current supply voltage V to the transmitter device 104 (using the supply voltage sensor 108) and the current temperature T (using the temperature sensor 110).

In step 206, the SoC 102 uses an empirical model of the gain behaviour of the front-end portion 104 as the supply voltage V, temperature T, input signal level I and carrier frequency f changes to determine the gain control signal 118 that will cause the front-end portion 104 so that the front-end portion delivers the desired gain. The SoC 102 calculates the appropriate gain control signal 118 for a set of possible input signal levels and carrier frequencies and populates a look-up table with all of the possible gain control values for every combination of possible input signal level and carrier frequency (for the current V and T).

In step 208, the SoC 102 determines the current input signal level I and carrier frequency f (from radio circuitry internal to the SoC 102). In step 210, the SoC 102 uses the pre-calculated values in the look-up table to determine the gain control signal appropriate for the current operating conditions (i.e. the current supply voltage V, temperature T, input signal level I and carrier frequency f). In step 212, the SoC 102 outputs the determined gain control signal to the amplifier portion 104, and the power amplifier 112 applies the corresponding gain to the radio signals 116.

As the transmitter device 100 operates, the operating conditions change. The SoC 102 regularly checks to see if the change in input signal level ΔI, carrier frequency Δf, supply voltage ΔV or temperature ΔT has exceeded predetermined thresholds.

In step 214, if the change in input signal level ΔI or carrier frequency Δf has exceeded the relevant threshold (e.g. because the transmitter device 100 has switched to a different carrier frequency as part of a frequency hopping protocol), the process returns to step 208, where I and f are determined and then to step 210, where the appropriate pre-calculated value for the gain control signal is retrieved from the look-up table for the new input signal level and/or new frequency. Retrieving a new value from the look-up table in step 210 can be done very quickly and thus is appropriate for adjusting the gain control signal in response to changes in fast-changing operating conditions such as the input signal level I and the carrier frequency.

Over a longer timescale (e.g. seconds or minutes), the change in supply voltage ΔV and/or temperature ΔT may exceed a respective threshold. In step 216, if the change in supply voltage ΔV and/or temperature ΔT has exceeded the relevant threshold, the process returns to step 204, V and T are determined and then to step 206 where a new look-up table is populated with of all the possible gain control values for every combination of possible input signal level and carrier frequency (for the current V and T). Generating a new look-up table when there are changes in V and T requires additional time and processing power but avoids the need to store look-up tables for every combination of every operating condition, which may be impractical.

The gain control signal 118 is thus updated throughout operation as the operating conditions change to maintain the gain delivered by the front-end portion 104 at or near the desired gain (and thus the transmission power at or near the regulatory transmission power limit).

Figure 3:
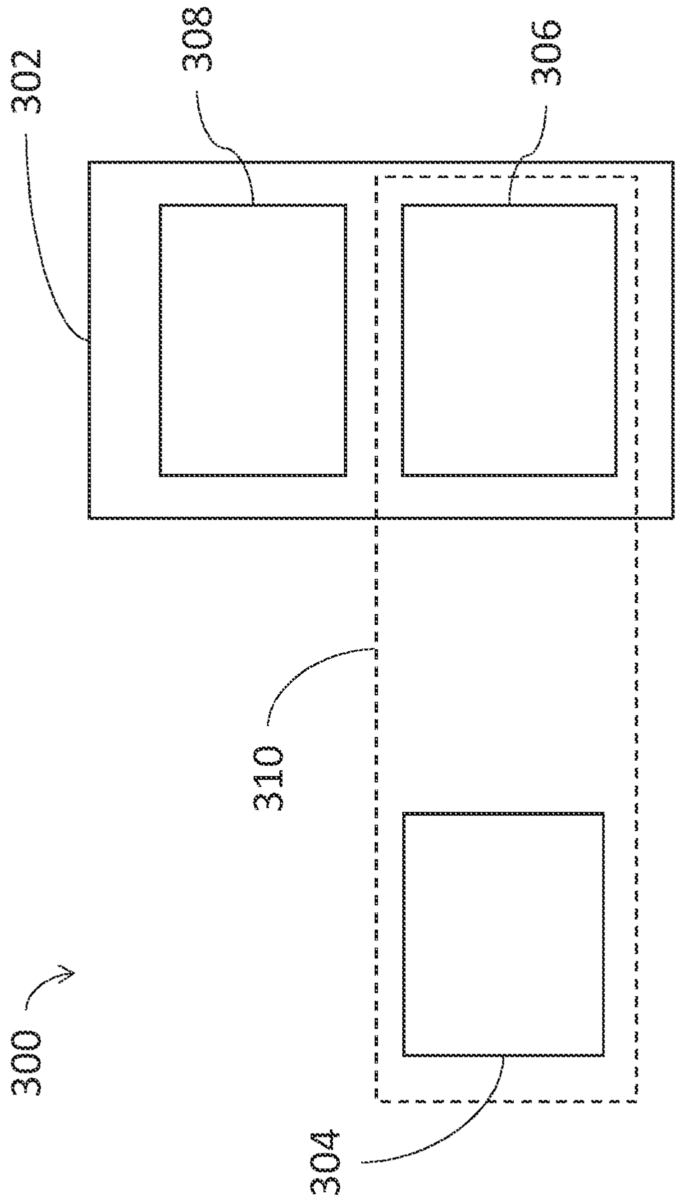
FIG. 3 is a schematic diagram of a transmitter system according to an embodiment of the invention.

FIG. 3 shows a transmitter system 300 comprising a transmitter device 302 and a remote server 304 acting as a remote processing device. The transmitter device 302 comprises a local control element 306 and an amplifier portion 308. The local control element 306 and the remote server 304 together form a control portion 310 of the transmitter system 300. The configuration and operation of the transmitter system 300 is essentially the same as that of the transmitter device 100 described above with reference to FIGS. 1 and 2. However, in this example the transmitter device 302 uses the remote server 304 to provide additional processing resources when needed. The functions of the control portion 310 are performed partially remotely by the remote server 304 and partially locally by the local control element 306.

While the invention has been described in detail in connection with only a limited number of embodiments, it should be readily understood that the invention is not limited to such disclosed embodiments. Rather, the invention can be modified to incorporate any number of variations, alterations, substitutions or equivalent arrangements not heretofore described, but which are commensurate with the scope of the invention. Additionally, while various embodiments of the invention have been described, it is to be understood that aspects of the invention may include only some of the described embodiments. Accordingly, the invention is not to be seen as limited by the foregoing description, but is only limited by the scope of the appended claims.

The invention claimed is:

1. A control portion for controlling an amplifier portion of a transmitter device, said amplifier portion arranged to amplify a radio signal with a transmission gain based at least partially on a gain control signal and having a nominal gain relationship between the gain control signal and the transmission gain, wherein the control portion is arranged:

to determine a desired transmission gain;

to determine one or more operating conditions;

to calculate a gain control signal for causing the amplifier portion to apply the desired transmission gain, taking into account the nominal gain relationship and the one or more operating conditions, the gain control signal being different to a gain control signal calculated based only on the nominal gain relationship; and to output said gain control signal; and wherein the control portion has stored a set of gain control signals for causing the amplifier portion to apply the desired transmission gain, for a corresponding set of the one or more operating conditions; and wherein the control portion is arranged to determine an updated gain control signal in response to changes in one or more operating conditions, wherein determining the updated gain control signal comprises:

calculating the gain control signal using a model of the amplifier portion for some changes in operating conditions; and retrieving an appropriate gain control signal from the set of gain control signals for other changes in operating conditions.

2. The control portion of claim 1, wherein the gain control signal indicates one of a plurality of gain settings for the amplifier portion in which the amplifier portion delivers different transmission gains.

3. The control portion of claim 1, wherein the one or more operating conditions includes one or more of temperature, humidity, supply voltage, input power level and carrier frequency.

4. The control portion of claim 1, wherein the desired gain is determined based on a desired transmission power.

5. The control portion of claim 1, arranged to calculate the gain control signal for causing the amplifier to apply the desired transmission gain using a model of the amplifier portion.

6. The control portion of claim 5, arranged to use the model to determine one or more parameters of a mathematical function which expresses an effective relationship between the gain control signal and an actual gain delivered by the amplifier portion.

7. The control portion of claim 6, wherein the effective relationship is expressed as a linear combination of a plurality of operating factors.

8. The control portion of claim 5, wherein the model used by the control portion comprises an empirical model of the amplifier portion.

9. The control portion of claim 1, arranged to update the calculated gain control signal at regular intervals and/or when the one or more operating conditions changes by a threshold amount.

10. The control portion of claim 1, arranged to calculate a set of gain control signals for causing the amplifier portion to apply the desired transmission gain for a corresponding set of the one or more operating conditions.

11. The control portion of claim 10, arranged to retrieve and output an appropriate gain control signal from the set when the one or more operating conditions change by a threshold amount.

12. The control portion of claim 11, arranged to re-calculate the gain control signal for some changes in operating conditions and to retrieve an updated gain control signal from a pre-calculated set for other changes in operating conditions.

13. A transmitter device comprising:

an amplifier portion arranged to amplify a radio signal with a transmission gain based at least partially on a gain control signal and having a nominal gain relationship between the gain control signal and the transmission gain; and a control portion as claimed in claim 1, arranged to control the amplifier portion by outputting the gain control signal to said amplifier portion.

14. The transmitter device of claim 13, comprising one or more sensors arranged to measure the one or more operating conditions.

15. The transmitter device of claim 13, wherein the amplifier portion comprises an RF power amplifier.

16. A transmitter system comprising:

a transmitter device comprising an amplifier portion arranged to amplify a radio signal with a transmission gain based at least partially on a gain control signal and having a nominal gain relationship between the gain control signal and the transmission gain; and a control portion as claimed in claim 1, arranged to control the amplifier portion by outputting the gain control signal to said amplifier portion, wherein at least part of the control portion is separate to the transmitter device.

17. A method of controlling an amplifier portion of a transmitter device, said amplifier portion arranged to amplify a radio signal with a transmission gain based at least partially on a gain control signal and having a nominal gain relationship between the gain control signal and the transmission gain, the method comprising:

determining a desired transmission gain;

determining one or more operating conditions;

calculating a gain control signal or causing the amplifier to apply the desired transmission gain, taking into account the nominal gain relationship and the one or more operating conditions, the gain control signal being different to a gain control signal calculated based only on the nominal gain relationship; and outputting said gain control signal to the amplifier portion; and storing a set of gain control signals for causing the amplifier portion to apply the desired transmission gain, for a corresponding set of the one or more operating conditions;

determining an updated gain control signal in response to changes in one or more operating conditions, wherein determining the updated gain control signal comprises:

calculating the gain control signal using a model of the amplifier portion for some changes in operating conditions; and retrieving an appropriate gain control signal from the set of gain control signals for other changes in operating conditions.

* * * * *